United States Patent
Thrasher et al.

(10) Patent No.: US 11,520,369 B2
(45) Date of Patent: Dec. 6, 2022

(54) CLOCK INSTANTANEOUS TEMPERATURE-RATE-OF-CHANGE MEASUREMENT

(71) Applicant: QUALCOMM Incorporated, San Diego, CA (US)

(72) Inventors: Robert Dale Thrasher, Irvine, CA (US); Jordan Cookman, San Jose, CA (US); Duong Hoang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 337 days.

(21) Appl. No.: 16/781,976

(22) Filed: Feb. 4, 2020

(65) Prior Publication Data

US 2021/0240217 A1 Aug. 5, 2021

(51) Int. Cl.

| | | |
|---|---|---|
| *G01R 19/32* | (2006.01) | |
| *G01R 21/02* | (2006.01) | |
| *G01R 21/14* | (2006.01) | |
| *G01R 5/26* | (2006.01) | |
| *G06F 1/08* | (2006.01) | |
| *G01K 13/00* | (2021.01) | |
| *G01R 23/02* | (2006.01) | |
| *G01R 21/00* | (2006.01) | |
| *G01R 19/22* | (2006.01) | |
| *G01R 21/04* | (2006.01) | |
| *G01R 19/03* | (2006.01) | |
| *G01R 5/22* | (2006.01) | |

(52) U.S. Cl.
CPC ............... *G06F 1/08* (2013.01); *G01K 13/00* (2013.01); *G01R 19/225* (2013.01); *G01R 21/00* (2013.01); *G01R 21/02* (2013.01); *G01R 23/02* (2013.01); *G01R 5/22* (2013.01); *G01R 19/03* (2013.01); *G01R 21/04* (2013.01)

(58) Field of Classification Search
CPC . G06F 1/08; G01K 13/00; G01K 7/22; G01K 3/14; G01R 23/02; G01R 21/00; G01R 21/02; G01R 19/225; G01R 21/04; G01R 19/03; G01R 5/22; G01S 19/235
USPC ............... 324/72, 76.11–76.83, 92, 104–106
See application file for complete search history.

(56) References Cited

U.S. PATENT DOCUMENTS

| | | | | |
|---|---|---|---|---|
| 6,021,266 A | * | 2/2000 | Kay ......................... | G06F 30/30 716/132 |
| 6,137,327 A | * | 10/2000 | Schnell ..................... | G11C 7/22 327/158 |
| 2014/0004800 A1 | | 1/2014 | Wu et al. | |
| 2014/0049331 A1 | | 2/2014 | Anandakumar et al. | |

(Continued)

OTHER PUBLICATIONS

International Search Report and Written Opinion—PCT/US2021/012457—ISA/EPO—dated Apr. 7, 2021.

*Primary Examiner* — Raul J Rios Russo
(74) *Attorney, Agent, or Firm* — Thien T. Nguyen

(57) ABSTRACT

Techniques described herein address these and other issues by utilizing two or more sensors to take temperature measurements from which a temperature-differential or instantaneous temperature rate-of-change, can be determined. In turn, this can be used to make a highly accurate model of the relationship between the temperature, temperature-differential, and clock circuitry frequency, to accurately estimate the frequency rate-of-change for frequency correction/compensation.

27 Claims, 5 Drawing Sheets

(56) References Cited

U.S. PATENT DOCUMENTS

| | | |
|---|---|---|
| 2014/0218119 A1 | 8/2014 | He |
| 2019/0190296 A1* | 6/2019 | Paralikar .............. A61M 25/00 |
| 2019/0199315 A1 | 6/2019 | Murakami et al. |
| 2021/0240217 A1* | 8/2021 | Thrasher ................. G01K 7/22 |
| 2021/0259460 A1* | 8/2021 | Siu ......................... A47J 36/32 |

* cited by examiner

CLOCK INSTANTANEOUS TEMPERATURE-RATE-OF-CHANGE MEASUREMENT

BACKGROUND

The stability of clock circuitry, such as a crystal oscillator (XO) clock, in electronics can be a limiting factor in many functions provided by modern day electronic devices. For example, in Global Navigation Satellite System (GNSS) applications, the XO may exhibit unpredictable changes in frequency that, when used for generating the local oscillator (LO) used for down-converting the received radio frequency (RF) signal to the baseband, result in a down-converted signal reflecting unpredictable frequency changes the limit the extended coherent integration of correlation data in GNSS receivers.

Temperature acting on the XO can be a large factor in the unpredictable frequency changes in the XO, but current solutions have shortcomings. Temperature compensated XOs (TCXOs), for example, can be relatively expensive. Other solutions using a temperature sensor thermally coupled to the XO allow for measurement of temperature at a given time. But because the relationship of the XO frequency to temperature is non-linear, this may not provide enough information to determine the XO frequency accurately.

BRIEF SUMMARY

Techniques described herein address these and other issues by utilizing two or more sensors to take temperature measurements from which a temperature-differential or instantaneous temperature rate-of-change, can be determined. In turn, this can be used to make a highly accurate model of the relationship between the temperature, temperature-differential, and clock circuitry frequency, to accurately estimate the frequency rate-of-change for frequency correction/compensation.

An example system for determining a frequency rate-of-change of clock circuitry, according to the description, comprises an assembly of electrical components on a substrate. The assembly of electrical components comprises the clock circuitry, a heat source, and a plurality of thermal sensors. A first thermal sensor of the plurality of thermal sensors is on the substrate on a proximal side of the clock circuitry, relative to the heat source, and a second thermal sensor of the plurality of thermal sensors is on the substrate on a distal side of the clock circuitry, relative to the heat source. The system further comprises a processing unit communicatively coupled with the first thermal sensor, the second thermal sensor, and the clock circuitry. The processing unit is configured to determine a temperature-differential based on temperature measurements from each of the first thermal sensor and the second thermal sensor, and determine a frequency rate-of-change of the clock circuitry, based at least in part on the determined temperature-differential.

An example method of determining a clock frequency rate-of-change of clock circuitry, according to the description, comprises obtaining a temperature measurement from each of a first thermal sensor and a second thermal sensor, wherein the first thermal sensor is on a substrate on a proximal side of the clock circuitry, relative to a heat source, the second thermal sensor is on the substrate on a distal side of the clock circuitry, relative to the heat source. The method further comprises determining a temperature-differential based on the temperature measurement from each of the first thermal sensor and the second thermal sensor, and determining a frequency rate-of-change of the clock circuitry based at least in part on the determined temperature-differential.

An example device, according to the description, comprises means for obtaining a temperature measurement from each of a first thermal sensing means and a second thermal sensing means, wherein the first thermal sensing means is on a substrate on a proximal side of clock circuitry, relative to a heat source, and the second thermal sensing means is on the substrate on a distal side of the clock circuitry, relative to the heat source. The device further comprises means for determining a temperature-differential based on the temperature measurement from each of the first thermal sensing means and the second thermal sensing means, and means for determining a frequency rate-of-change of the clock circuitry based at least in part on the determined temperature-differential.

An example non-transitory computer-readable medium, according to the description, comprises instructions embedded thereon that, when executed by one or more processing units, cause the one or more processing units to obtain a temperature measurement from each of a first thermal sensor and a second thermal sensor, wherein the first thermal sensor is on a substrate on a proximal side of clock circuitry, relative to a heat source, and the second thermal sensor is on the substrate on a distal side of the clock circuitry, relative to the heat source. The instructions, when executed by the one or more processing units, further cause the one or more processing units to determine a temperature-differential based on the temperature measurement from each of the first thermal sensor and the second thermal sensor, and determine a frequency rate-of-change of the clock circuitry based at least in part on the determined temperature-differential.

Figure 1:
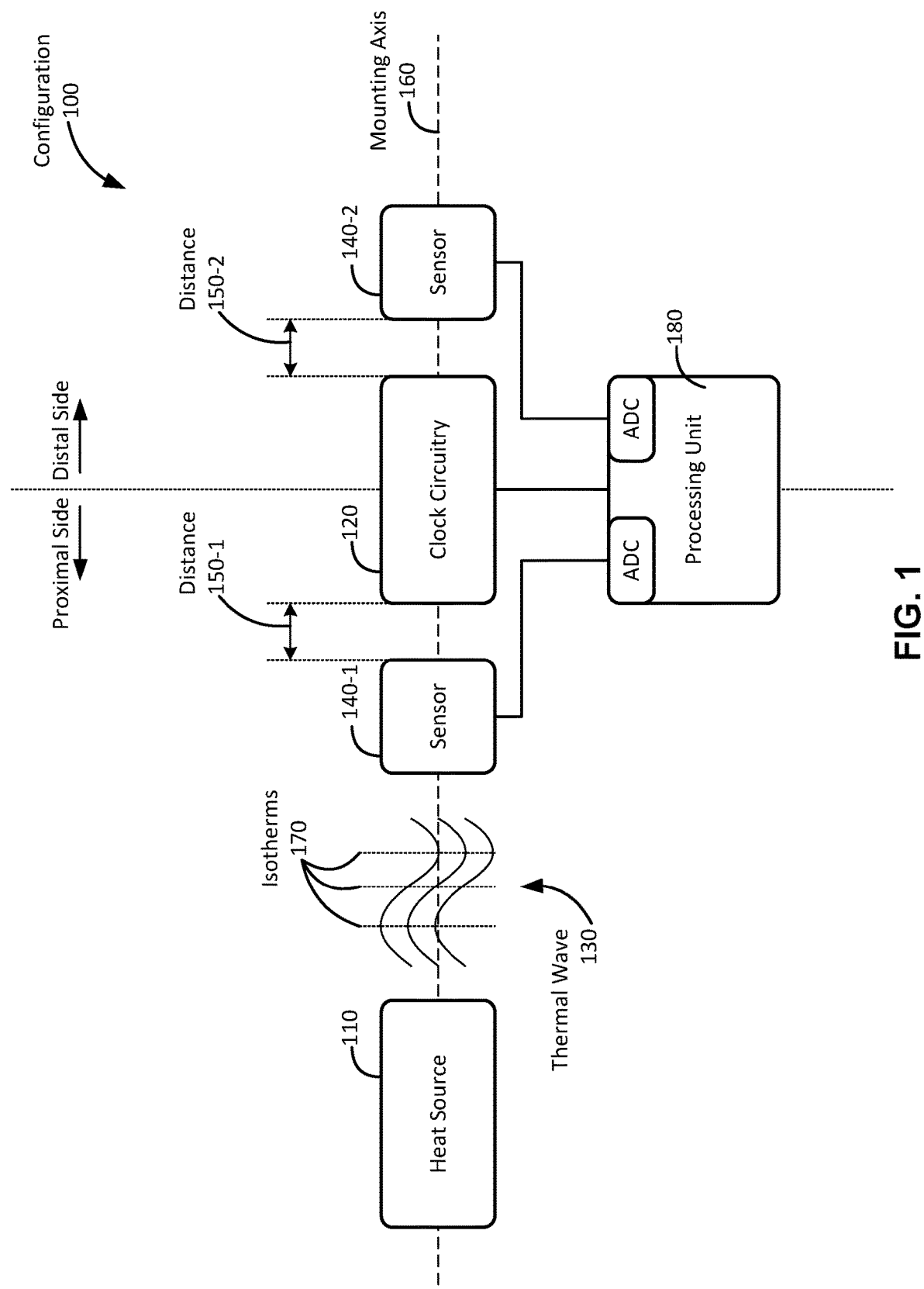
FIG. 1 is a block diagram of a configuration of electrical components in which a clock frequency rate-of-change can be determined using an instantaneous temperature-differential measurement, according to an embodiment.

Like reference symbols in the various drawings indicate like elements, in accordance with certain example implementations. In addition, multiple instances of an element may be indicated by following a first number for the element with a letter or a hyphen and a second number. For example, multiple instances of an element 110 may be indicated as 110-1, 110-2, 110-3 etc. or as 110*a*, 110*b*, 110*c*, etc. When referring to such an element using only the first number, any instance of the element is to be understood (e.g., element 110 in the previous example would refer to elements 110-1, 110-2, and 110-3 or to elements 110*a*, 110*b*, and 110*c*).

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

As previously stated, one of the limiting factors for extended coherent integration of correlation data in GNSS receivers is XO stability. In other words, the XO may exhibit unpredictable changes in frequency that, when used for generating the local oscillator used for down-converting the received RF signal to baseband, will result in a down-converted signal reflecting unpredictable frequency changes as well. Because these changes in frequency are unpredictable, may not be possible to "tune" an LO or Numerically Controlled Oscillator (NCO) architecture to the frequency of the signal in a way that the baseband signal exhibits stable carrier phase during the extended coherent integration (which can last 100 ms or longer).

Traditional techniques for addressing this issue include modeling the impact of changes in XO temperature by thermally coupling a single temperature sensor (e.g., thermistor) to the XO so that changes in the temperature of the XO may be monitored and correlated with corresponding changes in frequency. These observations are typically put into an estimator which, after some training, generates an estimate of XO frequency as a function of temperature sensor reading in the absence of any other frequency observations (such as generating the GNSS position, velocity and precise time (PVT) solution).

Because traditional techniques typically use only one temperature sensor thermally coupled to the XO, they are capable of measuring only instantaneous temperature on the thermistor itself, rather than that on the XO at a different effective time epoch. The instantaneous temperature rate-of-change, for instance, cannot be measured from this single temperature sensor configuration. This is a disadvantage because temperature is non-linear function—particularly in the case where active components are injecting heat into the system in non-linear fashion. And although a temperature rate-of-change may be estimated over time, this cannot cleanly compensate for any spatial separation between the XO and the thermistor, even with a high sensor update rate.

Embodiments provided herein address these and other issues by utilizing two or more sensors to take temperature measurements from which a temperature-differential or instantaneous temperature rate-of-change, can be determined. In turn, this can be used to make a highly accurate model of the relationship between the temperature, temperature-differential, and frequency of an XO, to accurately estimate the frequency rate-of-change and frequency. This can be used to create a highly stable clock that can be used in a variety of applications. (In GNSS, for example, a highly accurate clock can help reduce the time needed for satellite acquisition, which can result in power savings.)

It is noted that, although embodiments herein describe techniques for determining an instantaneous temperature rate-of-change measurement for an XO, embodiments are not so limited. The techniques provided herein may apply to other temperature-dependent clock circuitry, and may be particularly beneficial in embodiments where the temperature dependency is nonlinear. A person of ordinary skill in the art will recognize other applications.

As used herein, the terms "frequency" of clock circuitry refer to an output frequency generated by the clock circuitry. Additionally, term "temperature-differential" may be used to refer to the difference in temperature measurements between two temperature sensors, and may not only reflect a difference in temperature over space, but also in time (e.g., as a thermal wave moves across a substrate). As described in more detail herein, an instantaneous "temperature rate-of-change measurement" may be derived from such a temperature-differential. As detailed herein, a frequency rate-of-change may (and other higher-order terms) may, in turn, be derived from the temperature rate-of-change measurement. The frequency rate-of-change and other terms can be integrated to provide the clock phase used to "stabilize" GNSS signal phase observations (from correlator outputs) for coherent integration over extended times.

FIG. 1 is a block diagram of a configuration 100 of electrical components in which a clock frequency rate-of-change can be determined using an instantaneous temperature rate-of-change measurement, according to an embodiment. Here, components may comprise an assembly of circuits on a common substrate (e.g., Printed Circuit Board (PCB)) and a heat source 110 may be sufficiently close to clock circuitry 120 (e.g., an XO) to expose the clock circuitry to a thermal wave 130 of sufficient magnitude to alter the frequency of the clock circuitry 120 beyond a threshold amount. (Considerations regarding the determination of this threshold amount are described in more detail below.)

Generally put, the heat source may comprise circuitry (e.g., discrete and/or integrated circuitry) that generates heat during operation, causing a thermal wave 130 that impacts the clock circuitry 120. (In FIG. 1, the thermal wave 130 travels away from the heat source 110 toward the clock circuitry 120, primarily via the substrate (not shown).) This heat source 110 can vary, depending on application. In some embodiments, for example, the heat source 110 may comprise a power management integrated circuit (PMIC), power amplifier, modem, microprocessor, and/or another type of heat-generating circuitry. Layout considerations may dictate how close the heat source 110 is to the clock circuitry 120.

As previously noted, the clock circuitry 120 may comprise an XO. However, embodiments are not so limited. In alternative embodiments, the clock circuitry 120 may comprise essentially any type of oscillator with an output frequency that is temperature dependent. As with the heat source 110, the clock circuitry may comprise discrete and/or integrated circuitry.

It can be noted that the determination of whether the clock circuitry 120 is impacted by temperature changes caused by a thermal wave 130 above a threshold amount may be application-specific. That is, the threshold amount may depend on any of a variety of factors, which may be specific to a particular application. These factors can include, for example, whether a particular application requires a high level of stability in a clock signal generated by the clock circuitry 120, how big of an impact temperature has on the clock circuitry 120 (which may depend on the type of clock circuitry used), the thermal characteristics (e.g., thermal conductivity) of the substrate to which the heat source 110 and clock circuitry 120 are coupled, and the like.

The frequency, amplitude, and/or shape of the thermal wave 130, too, may be taken into account when determining whether the heat source 110 may affect the frequency of the clock circuitry 120 beyond a threshold amount. For example, if a heat source 110 undergoes relatively slow changes in the amount of heat generated (e.g., the frequency of the thermal wave 130 is low), or if the wave shape is linear, then traditional frequency modeling and compensation may be sufficient in certain applications. However, if the thermal wave 130 generated by the heat source 110 is nonlinear and/or has a relatively high frequency, the techniques provided herein for determining a frequency rate-of-change estimation of the clock circuitry 120 can be particularly useful. (That said, embodiments in which the thermal wave 130 is linear and/or has a relatively low frequency may still benefit from the techniques provided herein.)

As illustrated, to provide for an accurate determination of a frequency rate-of-change estimation of the clock circuitry 120 caused by the thermal wave 130, embodiments of a configuration 100 may comprise two or more temperature sensors 140-1 and 140-2 (collectively and generically referred to herein as sensors 140) configured to measure a temperature-differential across the clock circuitry 120. To do so, sensors 140 can be located near the clock circuitry 120, but do not necessarily have to be equidistant from the clock circuitry 120. That is, in some embodiments, a first distance 150-1 between a first sensor 140-1 and the clock circuitry 120 may be different than a second distance 150-2 between a second sensor 140-2 and the clock circuitry 120. In such instances, when determining an instantaneous temperature rate-of-change measurement for the clock circuitry 120 based on a temperature-differential between sensors 140, the output measurement from a sensor 140 closer to the clock circuitry 120 may be given more weight than an output from a sensor 140 further away from the clock circuitry 120. In this way, the determination of the instantaneous temperature rate-of-change of the clock circuitry 120 may be made more accurate.

Further with regard to the distance 150 between sensors 140 and the clock circuitry 120, it may be desirable, in some applications, to locate sensors 140 close enough to the clock circuitry 120 to help reduce the noise to determine a more accurate estimate the instantaneous temperature rate-of-change of the clock circuitry 120. Additionally, however, is the consideration that maintaining at least a minimal distance between the two sensors can help ensure spatial information is preserved to be able to obtain different temperature measurements from the sensors 140. Factors that may be taken into account when balancing these considerations, include, for example, the dimensions of the clock circuitry 120 and sensors 140 themselves, the amount of thermal coupling between the substrate and the various components, the dimensions and composition of the substrate to which components are coupled, passive and/or active heat dissipation components or techniques used, and more.

According to embodiments, sensors 140 may comprise thermistors, which provide an output voltage (or current) that varies depending on the temperature. Depending on desired functionality, the output may be indicative of an absolute or relative temperature, and may be provided to Analog to Digital Converter (ADC) inputs of a processing unit 180, as shown in FIG. 1. The processing unit 180 can process the temperature readings as described herein below to determine an estimated frequency rate-of-change of the clock circuitry 120. (As shown, in some embodiments, the processing unit 180 may receive the clock output of the clock circuitry 120.) (In alternative embodiments, the sensors 140 and processing unit 180 may be communicatively coupled with each other in an alternative fashion, which may include intervening amplifiers, buffers, ADCs, and/or other circuitry.) As such, the processing unit 180 may comprise without limitation one or more general-purpose processors, one or more special-purpose processors (such as Digital Signal Processor (DSP) chips, graphics acceleration processors, application specific integrated circuits (ASICs), and/or the like), and/or other processing structure or means. Alternative embodiments, may utilize other chips, circuits, and/or other forms of logic instead or in addition to the processing unit 180 to perform the functionality described herein. Moreover, the processing unit 180 and/or equivalent chips/circuits/logic may be located in other positions—relative to the clock circuitry 120—than those shown herein. The frequency rate-of-change determined by the processing unit 180 then can be corrected and/or compensated for (e.g., by the processing unit 180 or other circuitry (not shown) communicatively coupled therewith).

Figure 3:
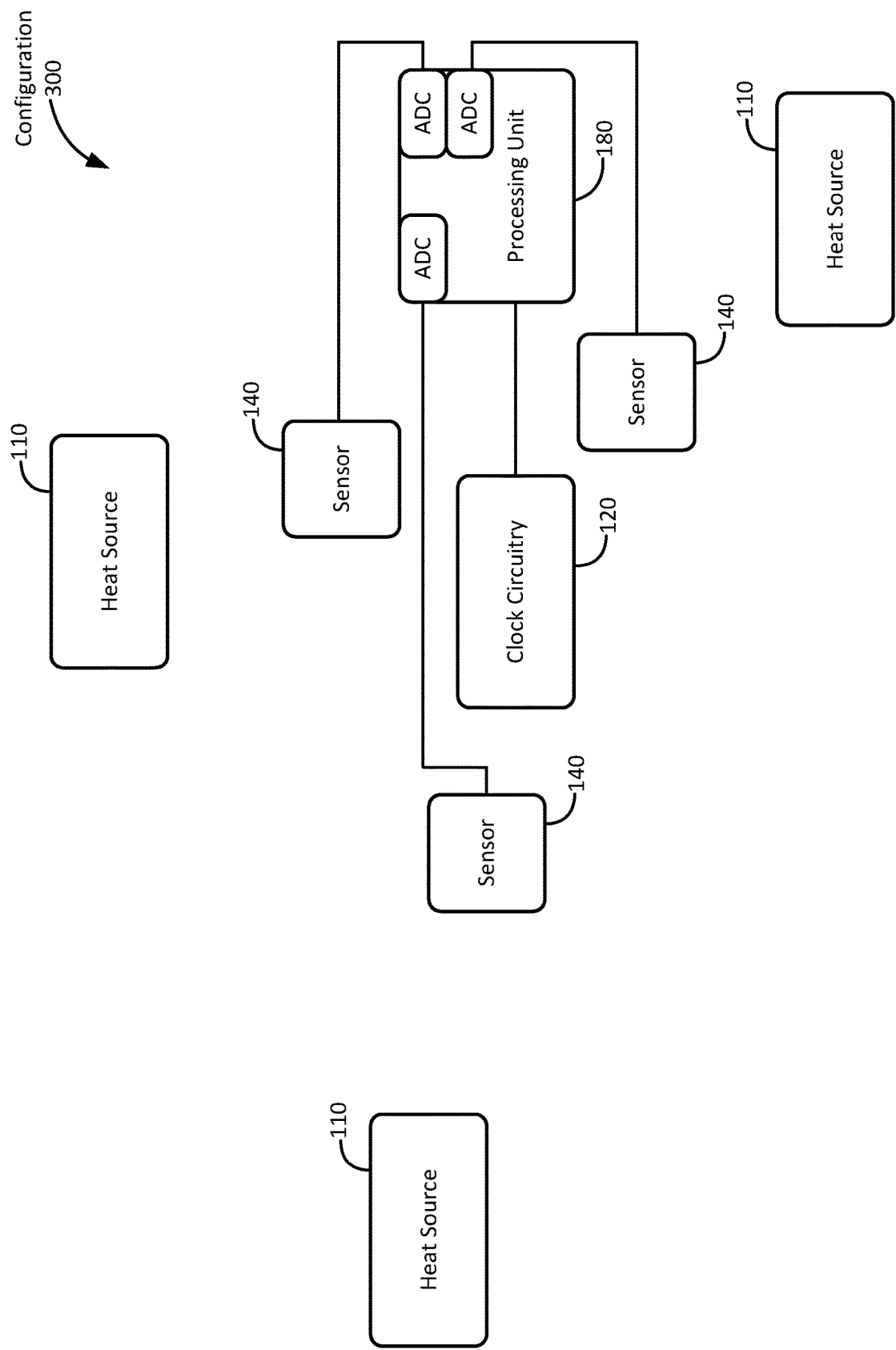
FIG. 3 is a block diagram of a configuration of electrical components in which a clock frequency rate-of-change can be determined using an instantaneous temperature-differential measurement, according to yet another embodiment.

The location of the sensors 140 relative to the clock circuitry 120 may vary, depending on desired functionality, layout limitations, and/or other factors. Configuration 100 of FIG. 1 shows layout in which the first sensor 140-1 is located between the heat source 110 and clock circuitry 120, and the second sensor 140-2 is located on the opposite side of the clock circuitry 120 (relative to the first sensor 140-1) such that the heat source 110, clock circuitry 120, and sensors 140 are all substantially aligned along a mounting axis 160 (which is defined by a line connecting the heat source 110 and the clock circuitry 120). Because the mounting axis 160 is substantially perpendicular to isotherms 170 of the thermal wave 130 generated by the heat source 110, this configuration 100 is particularly effective at measuring a temperature-differential across the clock circuitry 120. That said, embodiments are not so limited. Generally put, embodiments may include one or more sensors 140 on a proximal side of the clock circuitry 120 relative to the heat source 110, and one or more additional sensors on a distal side of the clock circuitry 120 relative to the heat source 110, where proximal side and distal side of the clock circuitry relative to the heat source are generally defined as shown in FIG. 1 (e.g., boarder extending out from the clock circuitry 120 in a direction perpendicular the mounting axis 160). (In such embodiments, therefore, sensors 140 may not be aligned along a mounting axis 160. An example of this is shown in FIG. 3.)

The use of two or more sensors 140 situated with respect to the heat source 110 and clock circuitry 120 in this manner allows for the observation of a differential temperature between the different locations of the sensors 140, and a determination of an instantaneous temperature rate-of-change measurement for the clock circuitry 120. More specifically, as the heat source 110 varies in temperature (e.g., from changes from low to high power consumption, or vice versa), a thermal wave 130 travels through the configuration 100. The thermal wave 130 takes time to traverse between the sensors 140, causing a differential temperature between the sensors 140 that provides a metric from which a temperature rate-of-change measurement can be determined. These temperature measurements from the sensors 140, taken at substantially the same time (e.g., sampled by the processing unit 180 at substantially the same time) can be put into an estimator, which may be executed by the processing unit 180.

It can be noted that the sensors 140 may not produce the same temperature reading at the same temperature. (A temperature reading by one sensor, for example, may simply be relative with respect to other readings by that same sensor.) More generally, the shape of the temperature versus temperature measurement curves for the different sensors may not be the same. As such, bias, scale-factor, and higher-order terms may need to be estimated so that, after compensation, sensors 140 generate a common temperature estimate when exposed to the same temperature. Once these parameters have been estimated with sufficient accuracy, the corrected temperature estimates from each sensor are used to obtain the differential temperature, between sensors 140, from which the temperature rate-of-change measurement may be determined.

Figure 2:
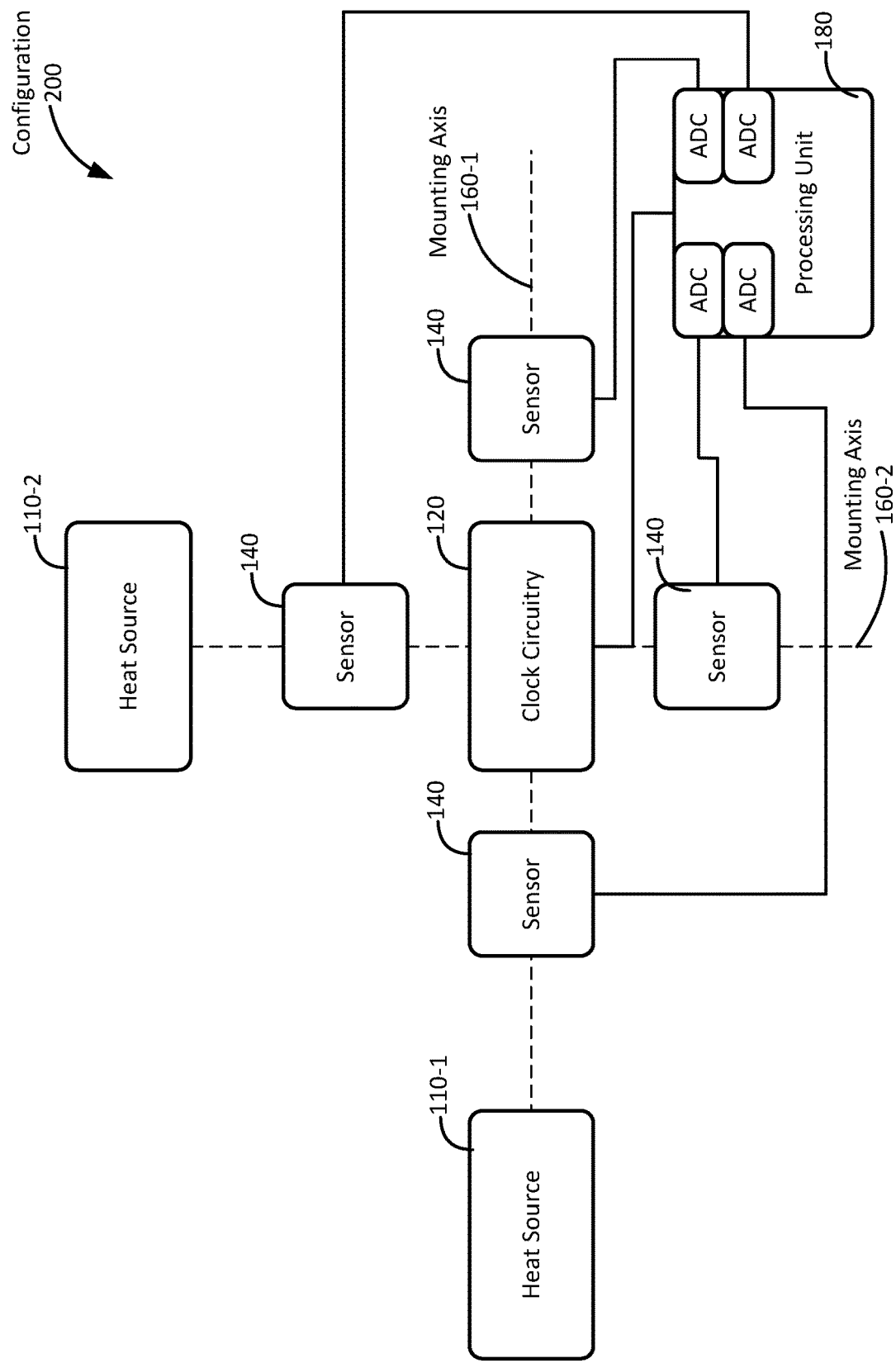
FIG. 2 is a block diagram of a configuration of electrical components in which a clock frequency rate-of-change can be determined using an instantaneous temperature-differential measurement, according to another embodiment.

The same principle can be extended to configurations having more than two sensors 140. FIG. 2, for example, is a block diagram of an alternative configuration 200 in which four sensors 140 are used to obtain temperature rate-of-change measurements for first and second heat sources 110-1 and 110-2, according to an embodiment.

Although sensor pairs are aligned along first and second mounting axes 160-1 and 160-2 to obtain measurements for first and second heat sources 110-1 and 110-2, respectively, embodiments are not so limited. As previously noted, sensors do not have to be coaxial with a heat source 110 and clock circuitry 120 to obtain such measurements. FIG. 3 shows an example.

FIG. 3 is a block diagram of yet another configuration 300, according to an embodiment. This configuration 300 illustrates an extreme case in which no two sensors 140 are coaxial with the clock circuitry 120 and any heat source 110. Even so, for each heat source 110 there is a sensor 140 on a proximal side of the clock circuitry 120 relative to the respective heat source 110, as well as a sensor 140 on a distal side of the clock circuitry 120, relative to the respective heat source 110. As such, the configuration 300 can still allow for a determination of a temperature-differential/instantaneous temperature rate-of-change for the clock circuitry 120. To do so, some embodiments may employ a training phase followed by an estimation phase, as illustrated in FIG. 4.

Figure 4:
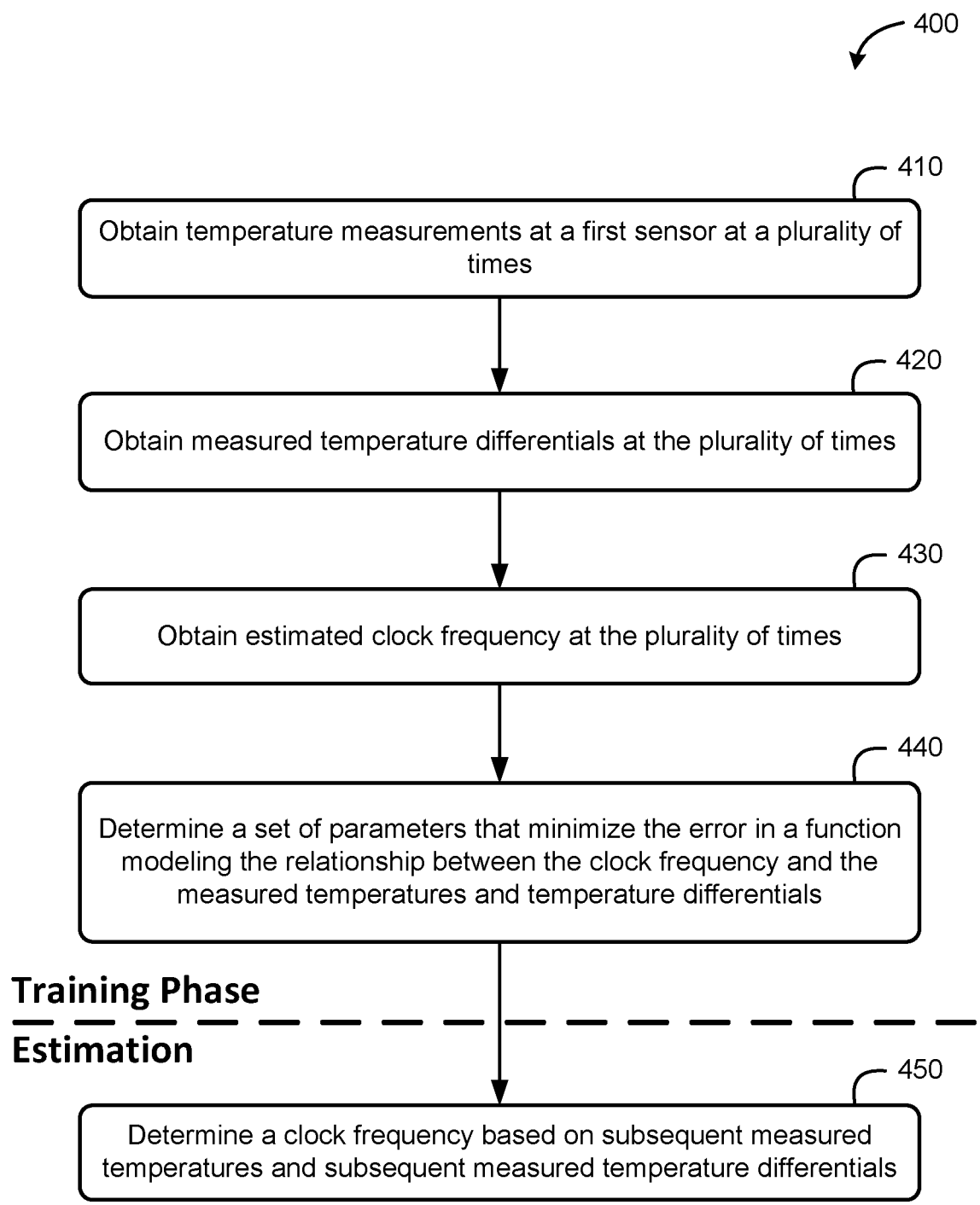
FIG. 4 is a flow diagram of a method of determining a temperature directional gradient, and ultimately a clock frequency rate-of-change estimation, according to an embodiment.

FIG. 4 is a flow diagram of a method 400 of training and using a model for estimating a clock frequency rate-of-change based on measured temperature-differentials, according to some embodiments. The description of the method 400 provided below is with regard to the configuration 100 of FIG. 1. However, it will be understood that the principles provided herein can be extended to other configurations, such as configurations 200 and 300 of FIGS. 2 and 3, and others.

At block 410, the functionality comprises obtaining temperature measurements at a first sensor and a plurality of times. Here, the first sensor comprises the sensor on the proximal side of the clock circuitry relative to the heat source (e.g., sensor 140-1 in FIG. 1), which is the sensor first exposed to a thermal wave generated by the heat source. The temperature measurements can be denoted as the vector, t, of all the temperature measurements on the sensor up to the time n. The vector can be denoted as:

$$t[n]=[t_n, t_{n-1}, \ldots, t_0]^T. \quad (1)$$

As indicated in block 420, the temperature-differentials also may be obtained at the plurality of times. Here, the temperature difference comprises a difference in temperature measured at the first sensor with a temperature measured a second sensor, where the second sensor is a sensor on the distal side of the clock circuitry relative to the heat source (e.g., sensor 140-2 in FIG. 1). These measurements, too, can be denoted as a vector. The vector, d, includes temperature differences between the first and the second sensors up to the time n. Vector d can be denoted as:

$$d[n]=[d_n, d_{n-1}, \ldots, d_0]^T. \quad (2)$$

The frequency of the clock circuitry as a function of the vectors t and d can then be modeled. In the general form, the frequency of the clock circuitry at time n can be modeled as:

$$f_{Clock}[n]=F[c,t,d], \quad (3)$$

where c is the vector containing the parameters determining the final shape of the function. In many embodiments, F may be modeled as a polynomial (of both t and d) with coefficients taken from the vector c.

At block 430 of FIG. 4, the training phase of the method 400 continues by obtaining an estimated clock frequency at the plurality of times. Here, the estimated frequency is determined from a frequency reference, such as the frequency estimator of GNSS or a Wireless Wide Area Network (WWAN). This estimated frequency at times n, n−1, . . . , 0, can be denoted as:

$$y[n], y[n-1], \ldots, y[0]. \quad (4)$$

With these frequency estimates, then, the method 400 can continue to block 440, where a set of parameters that minimize the error in a function modeling the relationship between the clock frequency and the measured temperatures and temperature-differentials is determined. That is, the parameters in vector c can be determined to minimize a cost function. In other words, the cost function may be chosen to make the error between the outputs of the function F and the training samples y as small as possible.

One example of a widely-used cost function is the sum of square errors function:

$$J(c)=\Sigma_{i=0}^{n}(y[i]-f[i])^2. \quad (5)$$

Here, vector c can be found either by directly solving the optimization problem of Equation (5) in batch mode or using some iterative techniques by starting with some initial guess of c, and then, as more samples become available, updating c such that the objective function is minimized. One of the known techniques is to use the Extended Kalman Filter (EKF).

In general, an EKF may be desirable for estimating the various parameters. Since temperature and temperature rate-of-change can ultimately be used in estimating the frequency and frequency rate-of-change of the clock circuitry, an EKF can be used to provide the transformation from temperature sensor inputs to frequency and frequency-rate-of-change estimates. As such, the various configurations illustrated in FIGS. 1-3, as well as other embodiments utilizing the techniques provided herein, can make an accurate and precise measurement of the clock circuitry frequency and frequency rate-of-change. The EKF states can be estimated using this frequency observation.

With the training phase at least partially complete, the method 400 can then proceed to the functionality at block 450, where clock frequency is determined based on subsequent measured temperatures and subsequent measured temperature-differentials. More specifically, once the parameters in vector c are known, t and d vectors can be constructed from new measurements and used with vector c in Equation (3) to provide a clock frequency estimation. It can be noted that, according to some embodiments, training may continue (e.g., as a background process) while results are used to estimate frequency. That is, in some embodiments, training may be ongoing even after the functionality of block 450 has started.

Figure 5:
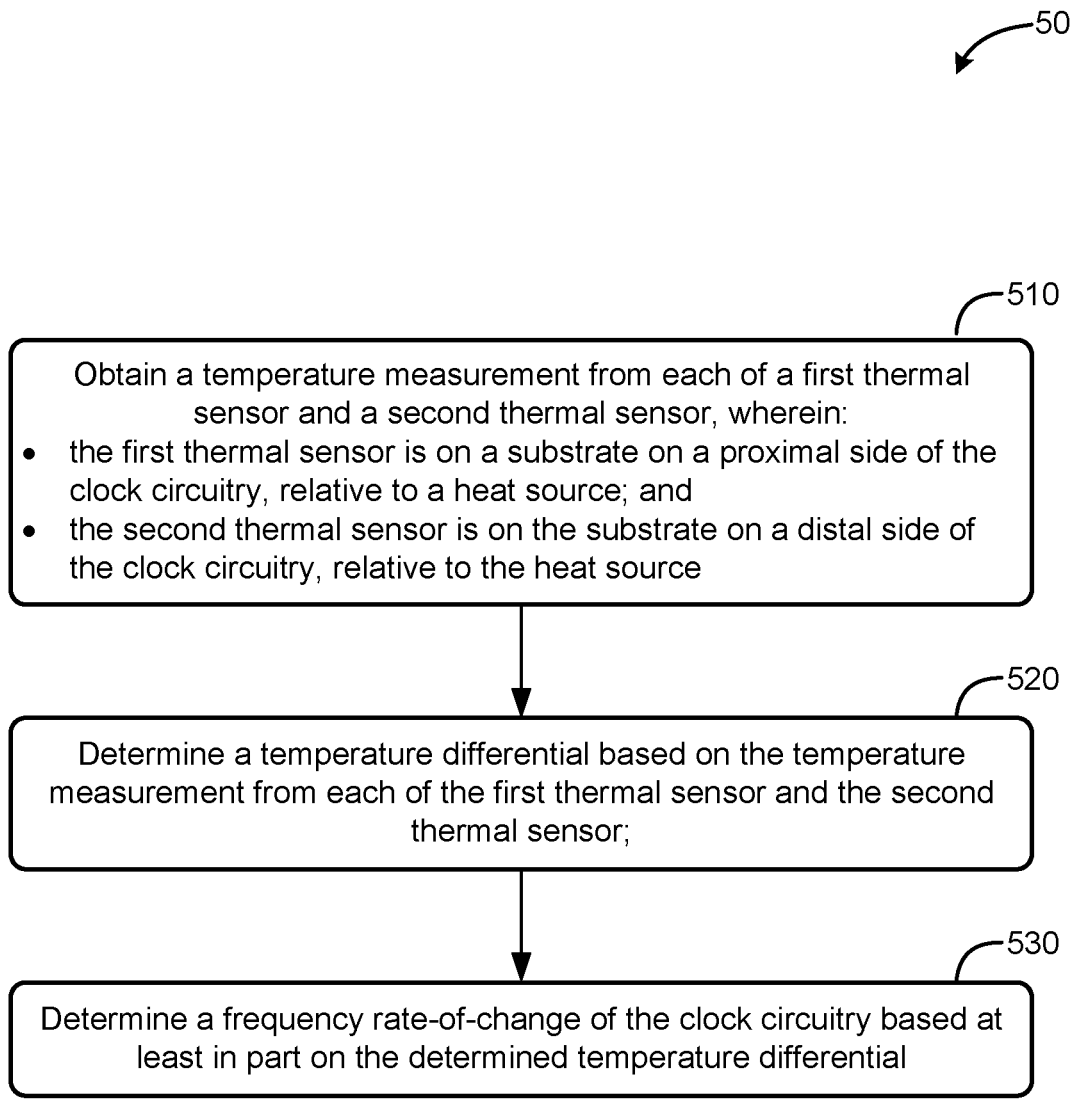
FIG. 5 a flow diagram of a method of determining a clock frequency rate-of-change of clock circuitry, according to an embodiment.

FIG. 5 is a flow diagram of a method 500 of determining a frequency rate-of-change of clock circuitry, according to an embodiment. Alternative embodiments may vary in function by combining, separating, or otherwise varying the functionality described in the blocks illustrated in FIG. 5. Means for performing the functionality of one or more of the blocks illustrated in FIG. 5 may comprise hardware and/or software components, such as a processing unit and/or other components of the configurations illustrated in FIGS. 1-3.

At block 510, the functionality comprises obtaining a temperature measurement from each of the first thermal sensor and a second thermal sensor, wherein the first thermal sensor is on a substrate on a proximal side of the clock relative to a heat source, and the second thermal sensor is on the substrate on a distal side of the clock circuitry relative to the heat source. According to some embodiments, as noted above, the clock circuitry, heat source, first thermal sensor, and second thermal sensor are substantially aligned along a common axis. That said, in other embodiments, one or more of these components may not be co-axial. Additionally or alternatively, the substrate may comprise a PCB and/or other circuit board, for example. In the clock circuitry and/or other components may comprise one or more Integrated Circuits (ICs) coupled to the substrate. In some embodiments, for example, the heat source may comprise a PMIC. Alternative embodiments may have additional or alternative heat sources (e.g., processing units, power circuitry, etc.). In some embodiments, the clock circuitry may comprise an XO circuit.

As previously noted, embodiments are not limited to a single heat source, or a single pair of thermal sensors. According to some embodiments, for example, there may be a second heat source (or more), and more than two thermal sensors. In some embodiments, (e.g., as shown in FIG. 2) a pair of thermal sensors may be used for each heat source, located on either side of the clock circuitry relative to the heat source. In other embodiments (e.g., the configuration 300 of FIG. 3), thermal sensors may be arranged in an alternate way.

Means for performing the functionality at block 510 may include thermal sensors, processing unit (including ADC inputs and/or software components), and/or other hardware and/or software components as illustrated in the configurations shown in FIGS. 1-3, and/or equivalents thereof.

At block 520, the functionality comprises determining a temperature-differential based on the temperature measurement from each of the first thermal sensor and the second thermal sensor (obtained at block 510). As previously described, a temperature-differential obtained from temperature measurements not only may be indicative of a spatial temperature gradient between the sensors, but also may be indicative of an instantaneous rate of temperature change (or temperature rate-of-change) of the clock circuitry. Moreover, as noted, distances between the sensors and the clock circuitry may be taken into account to more accurately obtain an instantaneous temperature rate-of-change determination. In some embodiments, the temperature-differential may be part of a larger set of differential measurements (e.g., vector d of equation (2) above) used to determine a frequency rate-of-change of the clock circuitry.

Means for performing the functionality at block 520 may include a processing unit (including ADC inputs and/or software components), and/or other hardware and/or software components as illustrated in the configurations shown in FIGS. 1-3, and/or equivalents thereof.

At block 530, a frequency rate-of-change of the clock circuitry can be determined, based at least in part on the determined temperature-differential. In some embodiments, determining the frequency rate-of-change of the clock circuitry may comprise using a model having a set of parameters (e.g., function F of equation (3)) that may be obtained during a training phase. Moreover, according to some embodiments, the processing unit may be further configured to determine the set of parameters based on a plurality of additional temperature measurements from each of the first thermal sensor in the second thermal sensor, and a frequency reference. As noted, the frequency reference may comprise a frequency estimator of a GNSS or a WWAN. The parameters themselves may be determined using an EKF and/or other state estimation techniques. The determination of the parameters may be made in a training phase, whereas the determination of the frequency rate-of-change may be made during an estimation phase. That said, in some embodiments the training phase may be ongoing, as noted below. And thus, the training phase in estimation phase may be continuing at the same time, and may do so indefinitely. This may be done to handle "aging" and other unknown changes to the model. Means for performing the functionality at block 530 may include a processing unit (including ADC inputs and/or software components), and/or other hardware and/or software components as illustrated in the configurations shown in FIGS. 1-3, and/or equivalents thereof.

Depending on desired functionality, alternative embodiments of the method 500 may include additional functionality. For example, some embodiments may further include determining a frequency of the clock circuitry based at least in part on the determined temperature-differential. Embodiments may further, responsive to determining the frequency rate of change of the clock circuitry, output information indicative of the determined frequency. This information can be provided in the form of an analog or digital output provided to circuitry used to compensate or correct for the determined frequency. The form of the output and the circuitry to which the output is given may vary, depending on application.

The method 500 of FIG. 5 may be executed in an ongoing manner, if so desired. That is, in some embodiments, temperature measurements may be gathered periodically (e.g. at a certain sampling rate), and a frequency rate-of-change and/or frequency of the clock circuitry may be estimated or predicted, then provided to correction or compensation circuitry to correct or compensate for the frequency. As noted, this can help in ultimately determining clock phase for GNSS signal phase observations integrated over an extended period of time. Alternatively, execution of one or more of the functions of the method 500 may be triggered by certain events, such as when the heat source is activated or reaches a threshold level of activity. In some embodiments, the correction or compensation circuitry may be separate from a processing unit configured to perform the method 500. In other embodiments, a processing unit performing method 500 also performs correction and/or compensation of the frequency. By engaging in continuous and/or triggered temperature measurement and clock correction in this matter, embodiments employing the techniques provided herein can help ensure clock stability for various applications.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components (e.g., processing units) that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, any other physical medium with patterns of holes, a Random Access Memory (RAM), a Programmable Read-Only Memory (PROM), Erasable PROM (EPROM), a FLASH-EPROM, any other memory chip or cartridge, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

What is claimed is:

1. A system for determining a frequency rate-of-change of clock circuitry, the system comprising:
   an assembly of electrical components on a substrate, the assembly of electrical components comprising:
   the clock circuitry;
   a heat source; and
   a plurality of thermal sensors, wherein:
     a first thermal sensor of the plurality of thermal sensors is on the substrate on a proximal side of the clock circuitry, relative to the heat source; and
     a second thermal sensor of the plurality of thermal sensors is on the substrate on a distal side of the clock circuitry, relative to the heat source; and
   a processing unit communicatively coupled with the first thermal sensor, the second thermal sensor, and the clock circuitry, wherein the processing unit is configured to:
     determine a temperature-differential based on temperature measurements from each of the first thermal sensor and the second thermal sensor; and
     determine a frequency rate-of-change of the clock circuitry, based at least in part on the determined temperature-differential.

2. The system of claim 1, wherein the processing unit is further configured to:
   determine a frequency of the clock circuitry, based at least in part on the determined temperature-differential; and
   responsive to determining the frequency of the clock circuitry, output information indicative of the determined frequency.

3. The system of claim 1, wherein the clock circuitry comprises a crystal oscillator (XO) circuit.

4. The system of claim 1, wherein the assembly of electrical components further comprises a second heat source, and wherein the plurality of thermal sensors comprises more than two thermal sensors.

5. The system of claim 1, wherein the heat source comprises a Power Management Integrated Circuit (PMIC).

6. The system of claim 1, wherein the clock circuitry comprises an integrated circuit coupled to the substrate.

7. The system of claim 1, wherein the clock circuitry, the heat source, the first thermal sensor, and the second thermal sensor are substantially aligned along a common axis.

8. The system of claim 1, wherein determining the frequency rate-of-change of the clock circuitry comprises using a model having a set of parameters, and wherein the processing unit is further configured to determine the set of parameters based on:
   a plurality of additional temperature measurements from each of the first thermal sensor and the second thermal sensor, and
   a frequency reference.

9. The system of claim 8, wherein the processing unit is configured to determine the set of parameters using an Extended Common Filter (EKF).

10. The system of claim 8, wherein the frequency reference comprises a frequency estimator of a Global Navigation Satellite System (GNSS) or a Wireless Wide Area Network (WWAN).

11. A method of determining a clock frequency rate-of-change of clock circuitry, the method comprising:
obtaining a temperature measurement from each of a first thermal sensor and a second thermal sensor, wherein:
the first thermal sensor is on a substrate on a proximal side of the clock circuitry, relative to a heat source; and
the second thermal sensor is on the substrate on a distal side of the clock circuitry, relative to the heat source;
determining a temperature-differential based on the temperature measurement from each of the first thermal sensor and the second thermal sensor; and
determining a frequency rate-of-change of the clock circuitry based at least in part on the determined temperature-differential.

12. The method of claim 11, further comprising:
determining a frequency of the clock circuitry, based at least in part on the determined temperature-differential; and
responsive to determining the frequency of the clock circuitry, outputting information indicative of the determined frequency.

13. The method of claim 11, wherein the clock circuitry comprises a crystal oscillator (XO) circuit.

14. The method of claim 11, wherein the heat source comprises a Power Management Integrated Circuit (PMIC).

15. The method of claim 11, wherein the clock circuitry comprises an integrated circuit coupled to the substrate.

16. The method of claim 11, wherein the clock circuitry, the heat source, the first thermal sensor, and the second thermal sensor are substantially aligned along a common axis.

17. The method of claim 11, wherein determining the frequency rate-of-change of the clock circuitry comprises using a model having a set of parameters, and wherein the method further comprises determining the set of parameters based on:
a plurality of additional temperature measurements from each of the first thermal sensor and the second thermal sensor, and
a frequency reference.

18. The method of claim 17, further comprising determining the set of parameters using an Extended Common Filter (EKF).

19. The method of claim 17, wherein the frequency reference comprises a frequency estimator of a Global Navigation Satellite System (GNSS) or a Wireless Wide Area Network (WWAN).

20. A device comprising:
means for obtaining a temperature measurement from each of a first thermal sensing means and a second thermal sensing means, wherein:
the first thermal sensing means is on a substrate on a proximal side of clock circuitry, relative to a heat source; and
the second thermal sensing means is on the substrate on a distal side of the clock circuitry, relative to the heat source;
means for determining a temperature-differential based on the temperature measurement from each of the first thermal sensing means and the second thermal sensing means; and
means for determining a frequency rate-of-change of the clock circuitry based at least in part on the determined temperature-differential.

21. The device of claim 20, further comprising:
means for determining a frequency of the clock circuitry, based at least in part on the determined temperature-differential; and
means for outputting information indicative of the determined frequency in response to determining the frequency of the clock circuitry.

22. The device of claim 20, wherein the clock circuitry comprises a crystal oscillator (XO) circuit.

23. The device of claim 20, wherein the heat source comprises a Power Management Integrated Circuit (PMIC).

24. The device of claim 20, wherein the clock circuitry, the heat source, the first thermal sensing means, and the second thermal sensing means are substantially aligned along a common axis.

25. The device of claim 20, wherein the means for determining the frequency rate-of-change of the clock circuitry comprises means for using a model having a set of parameters, and wherein the device further comprises means for determining the set of parameters based on:
a plurality of additional temperature measurements from each of the first thermal sensing means and the second thermal sensing means, and
a frequency reference.

26. A non-transitory computer-readable medium having instructions embedded thereon that, when executed by one or more processing units, cause the one or more processing units to:
obtain a temperature measurement from each of a first thermal sensor and a second thermal sensor, wherein:
the first thermal sensor is on a substrate on a proximal side of clock circuitry, relative to a heat source; and
the second thermal sensor is on the substrate on a distal side of the clock circuitry, relative to the heat source;
determine a temperature-differential based on the temperature measurement from each of the first thermal sensor and the second thermal sensor; and
determine a frequency rate-of-change of the clock circuitry based at least in part on the determined temperature-differential.

27. The non-transitory computer-readable medium of claim 26, wherein the instructions, when executed by the one or more processing units, further cause the one or more processing units to:
determine a frequency of the clock circuitry, based at least in part on the determined temperature-differential; and
output information indicative of the determined frequency in response to determining the frequency of the clock circuitry.

* * * * *